United States Patent
Huang et al.

(10) Patent No.: US 8,660,177 B2
(45) Date of Patent: Feb. 25, 2014

(54) PARALLEL ENTROPY CODING

(75) Inventors: Cheng Huang, Foster City, CA (US);
Jason N. Wang, Palo Alto, CA (US)

(73) Assignee: Sony Computer Entertainment Inc., Tokyo (JP)

(*) Notice: Subject to any disclaimer, the term of this patent is extended or adjusted under 35 U.S.C. 154(b) by 1008 days.

(21) Appl. No.: 12/731,117

(22) Filed: Mar. 24, 2010

(65) Prior Publication Data
US 2011/0235699 A1  Sep. 29, 2011

(51) Int. Cl.
*H04N 7/12* (2006.01)
*H04B 1/66* (2006.01)
*H04N 7/26* (2006.01)

(52) U.S. Cl.
CPC ....... *H04N 7/26106* (2013.01); *H04N 7/26755* (2013.01)
USPC ..................................... 375/240.02

(58) Field of Classification Search
None
See application file for complete search history.

(56) References Cited

U.S. PATENT DOCUMENTS

| | | | | |
|---|---|---|---|---|
| 5,138,447 A | * | 8/1992 | Shen et al. | 375/240.12 |
| 5,379,070 A | * | 1/1995 | Retter et al. | 375/240.2 |
| 6,081,622 A | * | 6/2000 | Carr et al. | 382/236 |
| 6,330,370 B2 | * | 12/2001 | Goyal et al. | 382/251 |
| 6,888,891 B2 | * | 5/2005 | Lee et al. | 375/240.19 |
| 7,630,565 B2 | * | 12/2009 | Linzer | 382/234 |
| 8,000,388 B2 | * | 8/2011 | Huang et al. | 375/240.03 |
| 2007/0086528 A1 | * | 4/2007 | Mauchly et al. | 375/240.24 |
| 2009/0110067 A1 | * | 4/2009 | Sekiguchi et al. | 375/240.12 |
| 2010/0061464 A1 | * | 3/2010 | Watanabe | 375/240.24 |

* cited by examiner

*Primary Examiner* — Nhon Diep
(74) *Attorney, Agent, or Firm* — Joshua D. Isenberg; JDI Patent

(57) ABSTRACT

Parallel coding of digital pictures is described. A digital picture is divided into two or more vertical sections. Two or more corresponding Stage 1 encoder units can perform a first stage of entropy coding on the two or more vertical sections on a row-by-row basis. The entropy coding of the vertical sections can be performed in parallel such that each Stage 1 encoder unit performs entropy coding on its respective vertical section and returns a partially coded Stage 1 output to a Stage 2 encoder unit. Each partially coded Stage 1 output includes a representation of data for a corresponding vertical section that has been compressed by a compression factor greater than 1. The Stage 2 encoder unit can generate a final coded bitstream from the partially encoded Stage 1 output as a Stage 2 output.

29 Claims, 9 Drawing Sheets

PARALLEL ENTROPY CODING

FIELD OF THE INVENTION

Embodiments of the present invention are related to video encoding and more particularly to parallel encoding of digital pictures.

BACKGROUND OF THE INVENTION

Digital signal compression is widely used in many multimedia applications and devices. Digital signal compression using a coder/decoder (codec) allows streaming media, such as audio or video signals to be transmitted over the Internet or stored on compact discs. A number of different standards of digital video compression have emerged, including H.261, H.263; DV; MPEG-1, MPEG-2, MPEG-4, VC1; and AVC (H.264). These standards, as well as other video compression technologies, seek to efficiently represent a video frame picture by eliminating or reducing spatial and temporal redundancies within a given picture and/or among successive pictures. Through the use of such compression standards, video contents can be carried in highly compressed video bit streams, and thus efficiently stored in disks or transmitted over networks.

MPEG-4 AVC (Advanced Video Coding), also known as H.264, is a video compression standard that offers significantly greater compression than its predecessors. The H.264 standard is expected to offer up to twice the compression of the earlier MPEG-2 standard. The H.264 standard is also expected to offer improvements in perceptual quality. As a result, more and more video content is being delivered in the form of AVC (H.264)-coded streams. Two rival DVD formats, the HD-DVD format and the Blu-Ray Disc format support H.264/AVC High Profile decoding as a mandatory player feature. AVC (H.264) coding is described in detail in ISO/IEC 14496-10: 2009, "Information technology—Coding of audio-visual objects—Part 10: Advanced Video Coding, Edition 5" May 13, 2009, which is incorporated herein by reference. A copy may be downloaded at the following URL: http://www.iso.org/iso/iso_catalogue/catalogue_tc/catalogue_detail.htm?csnumber=52974.

Video signal coding tends to be a computationally intensive application requiring a high memory bandwidth. Multi-processor systems have been developed with high computing performance and relatively lower power consumption. Some multi-processor systems have dedicated local memory associated with each processor core. It is appealing to implement video encoding on a multi-processor platform since the memory bandwidth in such systems may scale with the number of processors. However, due to the complexity of the encoding process it is difficult to optimize parallel video encoding for multi-processor platforms having more than two processor cores.

The video encoding process removes spatial and temporal redundancies between and within video pictures. However, this process can create data dependencies among video pixels. When encoding a video stream in parallel, these data dependencies tend to slow down the encoding process or lower the quality of the video stream being encoded. For example, encoding multiple sections of a given video picture in parallel may require each section to use data from another section. The required data may be momentarily unavailable if the section is currently being processed. The data dependency issue may be resolved by slowing down the encoding process, such that sections are sequentially encoded to avoid missing data dependencies. However, this may cause very large encoding delays. The data dependency issue may also be resolved by creating artificial data isolations to fill in for the currently inaccessible data dependency. This, however, may reduce the encoding quality of the video stream.

It is within this context that embodiments of the present invention arise.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

The video encoding process generally involves breaking down a picture into multiple sub-sections, performing a mode search to determine whether to use inter-prediction or intra prediction, followed by a process known as entropy coding. Entropy coding is a highly sequential process.

Entropy coding is zero/one based and highly sequential. As used herein, "zero/one based" has two meanings. First, Entropy coding tries to encode each symbol with a minimum number of 0s or 1s. In one entropy coding implementation known as context adaptive variable length coding (CAVLC), the 0s or 1s are called bits. In another entropy coding implantation known as context adaptive binary arithmetic coding (CABAC), the 0s or 1s are called bins. The CABAC coding compresses these bins into bits with content adaptive arithmetic coding. Both implementations of the Entropy encoding process involve data dependencies down to bit level, which makes the process highly sequential.

At a lowest level, entropy coding is "bit-based" meaning that a coding decision for a given bit depends on the result for a previous bit. For some codecs, the coding mechanism for each symbol is adaptive, meaning that the entropy coding tries to encode each symbol with a minimum number of bits. Such coding schemes attempt to code more probable symbols with a lesser number of bits. In some codecs, such as AVC, binary decisions are separate from final stream generation. In such codecs, binary decisions as to whether a bit will be coded as a zero or a 1 may be made based on video content. In addition, certain coding techniques, such as context adaptive binary arithmetic coding (CABAC), implement a further level of coding of bits. These various coding schemes place a large bandwidth requirement for implementing entropy coding on a single CPU core processor. Furthermore, the entropy coding process is not scalable.

Although AVC entropy coding is a sequential coding process, the inventors of the current invention have recognized that there are non-sequential parts of the process that can be localized and implemented in parallel.

A generalized parallel encoding process is described in commonly-assigned U.S. patent application Ser. No. 12/553,073, filed Sep. 2, 2009, the entire contents of which are incorporated herein by reference.

Figure 1:
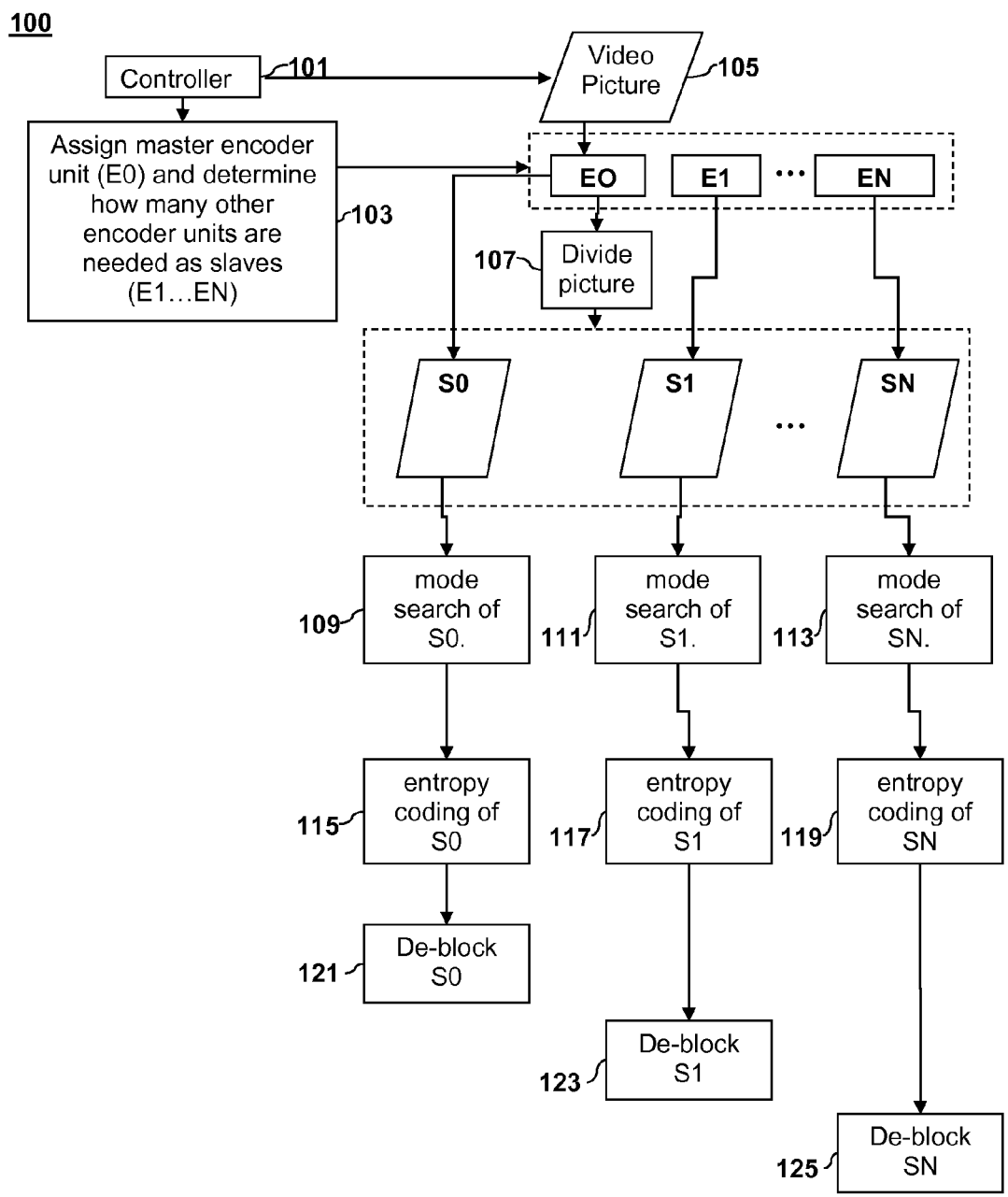
FIG. 1 is a flow diagram illustrating an example of parallel video encoding in accordance with an embodiment of the present invention.

FIG. 1 is a flow diagram illustrating an example of parallel video encoding 100 that deals with the issue of data dependency according to an embodiment of the present invention. As used herein, parallel video encoding generally refers to encoding different sections of a video picture or different video pictures in such a way that process of encoding the respective sections or pictures overlap in time. In the prophetic example illustrated in FIG. 1, a controller 101 (e.g., a digital computer processor) initially chooses an encoder unit (labeled E0) from among a plurality of such units available in a processing system to act as the master/server encoder for the task of encoding one or more video pictures. The controller 101 also determines how many additional encoder units are needed as clients/slaves of the master/server encoder E0 to perform parallel encoding as indicated at 103. The client/slave encoder units are labeled as E1 . . . EN, where N represents the total number of client/slave encoders that perform encoding in parallel with the master/server unit E0. The master server encoder unit E0, and client/slave encoder units E1 . . . EN may be implemented in the form of digital co-processors that may be less computationally intensive devices than the controller 101. Each such co-processor may optionally include an associated local storage that the co-process may quickly access. The local storage may store coded instructions that the co-processor can use to implement a part of the task of encoding a picture. The local storage may also store data to be processed by the co-processor by executing the stored instructions and/or data generated as a result of executing the stored instructions. In an alternative embodiment, each encoder unit may be an individual digital computer processor, e.g., a parallel processing system such as a CELL processor.

By way of example, the controller 101 may select encoder unit E0 as the master/server. The controller 101 may send encoder unit E0 a task package which may include encoded information that the master/server encoder E0 may use to determine where to find the video stream, how to encode the video stream, and how to categorize the content of the video stream. In determining how to encode the video stream, the following information may be included in the task package: 1) information regarding whether the bit rate should be high or low; 2) standard constraints including: the decoder level to be associated with the video stream, e.g., whether a simple or complex decoder will be used at the receiving end, the memory usage associated with the video stream, and a prediction mode associated with the video stream; and 3) feature constraints including: whether the video stream is associated with a fast playback mode or not, how fast the playback associated with the video stream is, and the device on which the video stream is to be played back. The categorization of content may include the color coding used (e.g., RGB or YUV) or a color matrix used to convert the video stream from one color code to another.

After the master/server encoder E0 receives the task package, it may begin the encoding process for a given video stream. The encoding process will typically begin with the first video picture of the video stream, but for the sake of example, the video encoding process is described below for an arbitrary video picture 105. The master/server encoder E0 divides the video picture 105 into N+1 vertical sections that correspond to the N+1 encoders available for parallel processing, as indicated at 107. Thus, in the present example, E0 is assigned section S0, E1 is assigned section S1, and so on and so forth up until the $N^{th}$ encoder unit EN, which is assigned section SN.

Each vertical section S0, S1, . . . SN includes data representing a portion of the complete video picture 105. Each vertical section includes at least one complete column of subsections of the picture. Examples of subsections include, but are not limited to individual pixels, blocks (4×4 groups of pixels), sub-macroblocks (8×8 groups of pixels), and macroblocks (MB) (16×16 groups of pixels). As used herein, a complete column refers to a column that extends from a top of the picture to a bottom of the picture. By way of example, and not by way of limitation, one complete column of macroblocks would be portion of a picture 1 macroblock wide by M macroblocks tall, where M is the number of rows of macroblocks in the picture.

In certain embodiments, the mode search may be performed in parallel by the encoder units E0, E1, . . . , EN. Each encoder unit E0, E1, . . . , EN can perform a mode search on its respective section S0, S1, . . . SN to determine whether each subsection (e.g., each MB) of the respective section should be inter-coded or intra-coded. This can include a motion search for a best inter-prediction match, an intra search for a best intra-prediction match, and an inter/intra comparison to decide how the MB should be coded. The master/server unit E0 begins by doing a mode search for the first row of macroblocks in order to determine whether each macroblock should be inter-coded or intra-coded as described at 109.

The master/server encoder E0 sends the search result of the right most MB and a proposed prediction mode of the left most MB in the right neighbor's section of each row to unit E1. Consequently, unit E1 has to wait for unit E0's right most MB mode search result and proposed prediction mode for E1's left most MB before unit E1 can start its mode search of this MB row. For the same reason, unit E2 waits for unit E1's right most MB result and proposed prediction mode for E2's left most MB, and so on. As the result, each encoder unit starts one MB row later than the unit handling its left neighbor section.

Because MB mode search and entropy encoding of a MB depend on its upper right neighbor MB, to finish the right most MB prediction search an encoder unit for a section that has a right neighbor needs the prediction mode of the left most MB in the right neighbor section. But, in this encoder implementation, the data dependencies from a right section to its left neighbor are not allowed. To solve this problem, the encoder unit for the left section has to search for the prediction mode of the first MB in its right neighbor section. Because the prediction may be done without knowing the correct upper right MB mode, the result may not be optimal. However, experiments have shown that this prediction mode is very close to the best. Then, the encoder unit for the right neighbor section only can accept this prediction mode and use this prediction mode to encode the left most MB in the right neighbor section into the output bit stream. In this way it is possible to guarantee that the entropy encoding result will be correct with very small loss in quality.

The mode searches carried out by the different units may overlap in time. For example, to some extent, unit E1 may be involved in a mode search for its $(N-1)^{th}$ row of subsections as described at 111 while unit EN is involved in a mode search for its first row of subsections as described at 113. This mode search is then repeated for the next row of subsections in each vertical section until mode searching for the entire video picture has been completed.

The mode search may include a task known as motion compensation to determine a mode result, e.g., whether intra-coding or inter-coding should be used. Specifically, a mode search performed on a section may produce a motion vector (MV) and a transform coefficient that are subsequently used along with one or more reference sections during motion compensation. The motion compensation may use these motion vectors and transform coefficients to describe the current section in terms of the transformation of a reference section to a currently processing section.

As used herein, the term motion compensation generally refers to a process to build pixel predictors from a reference picture. By way of example, and not by way of limitation, in certain encoder implementations motion compensation may be integrated with inter search process. After inter search, the encoder may use the resulting motion vector to build pixel predictors. Then, the encoder may use the original input pixel and pixel predictor to calculate a prediction error referred to as residual pixels. A discrete cosine transform (DCT) may be used to translate residual pixels into residual DCT coefficients. A process known as quantization reduces the number of symbols used to represent these DCT coefficients. The resulting quantized DCT coefficients may be used by an entropy coding task.

Once it is determined whether the subsections in each row should be inter-coded or intra-coded, entropy coding may be performed. As used herein, the term entropy coding generally refers to a task by which prediction modes, motion vectors and quantized residual DCT coefficients are translated into a compressed digital representation. The input of entropy coding task is the mode search result. The output is a compressed digital representation of the mode search result.

To further optimize the encoding of a video stream, a method of compressing variable length symbols may be implemented within the entropy encoding task. The output of the entropy encoding task for a given section of a picture may include a variable length code representing DCT coefficients for the residual pixels in the given section. The variable length code may be composed of multiple tokens each of which represents a subsection of the variable length code. The bit representation of these tokens are often compressed. Existing entropy coding techniques often use lookup tables to determine a bit representation for each token. This can lead to computational inefficiencies. In certain embodiments of the present invention entropy coding may be made more efficient by combining two or more tokens together. The resulting combination may be compared against a specially generated lookup table to determine a bit representation for the token combination. Such embodiments are discussed in detail below with respect to FIGS. 6A-6B of U.S. patent application Ser. No. 12/553,073, filed Sep. 2, 2009, which was incorporated by reference above.

The encoding process may include additional tasks. For example, within the mode search task, after mode search process, the encoder runs a decoder emulation process which is called encoder local decoding. In encoder local decoding process, the encoder uses inverse quantization to recover residual DCT coefficients from quantized DCT coefficients. Then, it uses inverse DCT to get residual pixels (prediction error) from residual coefficients. Combining the prediction error with pixel predictors, the encoder can get an uncompressed picture which should be exactly the same as the uncompressed picture generated by a standalone decoder. The uncompressed picture may be sent to a de-blocking task for de-blocking. The de-blocking process may be used to average out pixels at the block or MB boundaries. This is done to ensure that the encoded video picture fairly represents the original video picture. After de-blocking, the uncompressed picture may be saved and used as a reference picture to do inter prediction for future pictures.

Both the de-blocking task and entropy coding task may start when the mode search task is finished for one MB row. There is no timing dependency between de-blocking and entropy coding. However, as an extra timing constraint, the de-blocking task for one section may have to wait for completion of de-blocking of each MB row on a neighboring section due to data dependencies within the de-blocking task itself. For example, the de-blocking task on a given section may need to wait for the de-blocking of its left neighbor to send the de-blocking result of the right most MB of the left neighbor to the encoder unit handling the given section.

Furthermore, for de-blocking, there may be a one MB column overlap between the encoder units for neighboring vertical sections. For a MB shared by encoder units for two adjacent sections, the encoder unit that de-blocks the left section may perform vertical edge de-blocking on the shared MB and the encoder unit that de-blocks the right section may perform horizontal edge de-blocking on the shared MB. By way of example, the de-blocking task for the macroblocks in the first column of section S1 may be shared between section S0's encoder unit E0 and section S1's encoder unit E1. Encoder unit E0 may de-block the vertical edges of the macroblocks in the left most column of section S1 and encoder unit E1 may de-block the horizontal edges of these macroblocks.

Referring again to the example illustrated in FIG. 1, the master/slave encoder unit E0 begins by entropy encoding for each subsection in the current row of section S0 as described at 115. Unit E1 may simultaneously entropy encode each subsection in the current row of section S1 as described at 117. Unit EN may also simultaneously entropy encode each subsection in its current row of section SN as described at 119.

At a certain point, enough of a given section is encoded such that the de-blocking process for that section may begin. For example, de-blocking of section S0 by the master/server encoder E0 is indicated at 121. De-blocking of section S1 by the encoder E1 is indicated at 123. De-blocking of section SN by the encoder EN is indicated at 125. De-blocking may be implemented in parallel on the encoder units E0 . . . EN or off-loaded to a different processor entirely. An example of parallel de-blocking is described in commonly-assigned U.S. patent application Ser. No. 12/553,073, filed Sep. 2, 2009, the entire contents of which have been incorporated herein by reference above.

Embodiments of the present invention solve the problem of how to distribute the task of entropy encoding a picture to multiple encoder units and execute the task in parallel. In addition, embodiments of the present invention also address the problem of how to parallelize the encoding task within a slice.

One slice could cross multiple rows, or could even be smaller than one row. For example, as specified in the AVC standard, one slice could include any number of macroblocks from as few as 1 macroblock up to the number of macroblocks in a picture. Typically, the slice size can be determined by the user. The encoder can take the user assigned slice size to do encoding. By way of example, and not by way of limitation, a slice may be a row of subsections, e.g., a row of macroblocks.

It is noted that although each slice of the picture can be encoded independently, parallelizing entropy coding by assigning each slice to a different encoder unit is often impractical. This is because the number of slices in a picture may vary and cannot be controlled by the system doing the encoding. Furthermore, embodiments of the present invention address the problem of how data can be compressed before being transferred among encoder units, so that bandwidth and network delays can be reduced for relatively low cost.

1) Parallel Entropy Encoding Scope:

Parallel entropy encoding generally applies to slice data encoding. The majority of the entropy encoding task lies in slice data encoding, which includes encoding of all the subsection (e.g., macroblock) syntax elements for that portion of a slice that lies within a given vertical section. This task involves encoding the symbols that represent the relevant subsections into compressed symbols in the form of a bit representation. This can compress the symbol by a factor of about 50-100 depending on the quantization parameter used. Other syntax elements that may need to be encoded in certain coding standards, such as the AVC standard, include sequence parameter set, picture parameter set, and slice header.

Additional compression may be done on the compressed symbols depending on the coding standard used and the implementation details of the standard that is used. For example, the AVC standard can implement two types of entropy encoding for slice data referred to as context adaptive variable length coding (CAVLC) and context adaptive binary arithmetic coding (CABAC). Both CAVLC and CABAC implementations include compression of the symbols by a factor of about 50-100. For CABAC the 0-1 probability (Binary Arithmetic Coding) for each symbol can be applied, which further compresses the compressed symbols by an additional factor of about 1.3:1.

Figure 2:
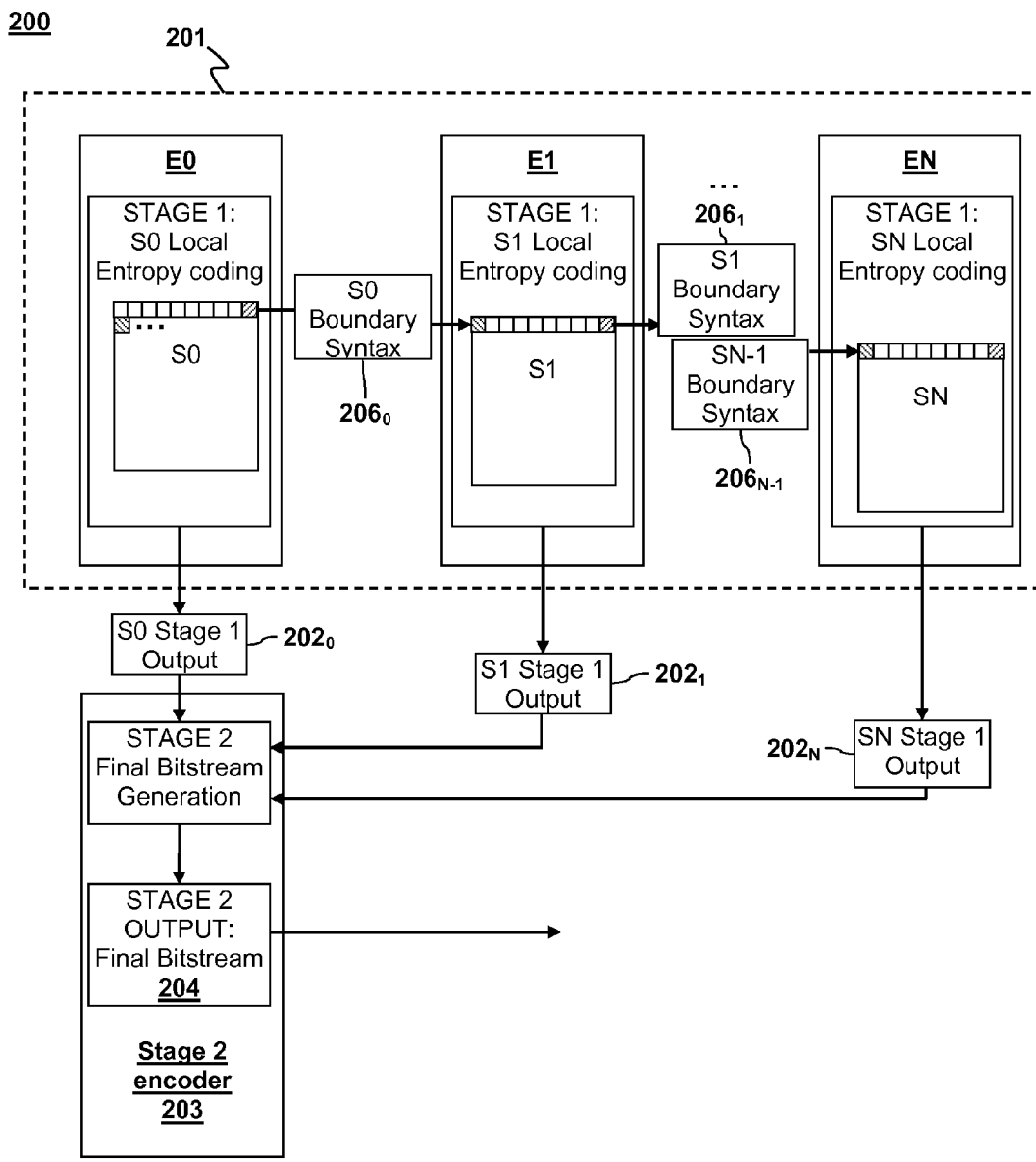
FIG. 2 is a block diagram illustrating an example of a parallel entropy coding system and method in accordance with an embodiment of the present invention.

2) Picture Partitioning for Parallel Entropy Encoding:

According to certain embodiments of the present invention, parallel entropy coding may be implemented as illustrated in FIG. 2. For parallel entropy encoding to work, a picture can be partitioned into multiple vertical sections, e.g., as described above with respect to FIG. 1. The encoding task can be divided into two stages denoted herein as Stage 1 and Stage 2. Stage 1 can be implemented in parallel by two or more Stage 1 encoder units 201. By way of example, and not by way of limitation, the entropy encoder unit E0 . . . EN may be configured, e.g., by suitable programming or equivalent hardware configuration, to perform Stage 1 of the entropy coding task on a corresponding one of the vertical sections S0 . . . SN. In Stage 1, each encoder unit E0 . . . EN can encode and generate the bit representations of the symbols that represent the relevant subsections of the corresponding sections S0 . . . SN. As noted above, this compresses the symbol data by a factor of about 50-100. The output of the Stage 1 entropy coding outputs $202_0$, $202_1$ . . . $202_N$ for each of the vertical sections S0, S1, . . . SN, including the compressed symbol data for each of the sections can be transmitted from the corresponding encoder units E0, E1, . . . EN in partially encoded bitstreams.

In Stage 2, a Stage 2 encoder unit 203 can form a final bitstream 204 using the Stage 1 outputs $202_0$ . . . $202_N$ from each of the Stage 1 encoder units 201. By way of example, and not by way of limitation, the Stage 2 encoder unit 203 may be a dedicated one of the encoder units E0 . . . EN, such as the master encoder unit E0. Alternatively, the Stage 2 encoder unit 203 may be an entirely separate processor module other than one of the encoder units E0 . . . EN. By way of example, and not by way of limitation, for a CABAC implementation of AVC, the 0-1 probability (Binary Arithmetic Coding) for each symbol can be done during Stage 2.

Depending on the codec used, there can be data dependencies among the different vertical sections S0 . . . SN for entropy encoding during Stage 1. For example, encoding a given MB may require some syntax information from a previous MB in the same row as the given MB and/or syntax information for a MB immediately above the given MB. Here the previous MB can be the MB to the immediate left of the given MB or, if the given MB is the first MB in a MB row, the previous MB can be the last MB in the MB row above the given MB. This means that encoding the first MB column of a vertical section can be dependent on the MB syntax info from the last MB column in its left neighbor vertical section.

Based on these observations, the inventors have developed a parallel entropy encoding scheme that includes a channel for data transfer between each video section and its right neighbor vertical section. If a video picture is divided into N vertical sections (N>0), there will generally be N−1 channels between neighboring vertical sections. These channels can be used to transfer MB syntax info of the last MB column of a video section to its right video section to encode the first MB column of that video section. Based on this structure, the first (e.g., leftmost) vertical section S0 can be entropy encoded by the master encoder unit E0 without depending on any other video sections. The slave encoder units E1 . . . EN can start encoding the other video sections S1 . . . SN after the first MB row of each unit's previous vertical section is completed. This makes it possible for parallel entropy encoding to proceed. Note that if a channel is allowed from the rightmost vertical section to the leftmost vertical section for transferring the last MB column's syntax information to the first MB column in a picture, then the whole process becomes a sequential encoding process, and one loses the benefit of parallel encoding. In some codecs, there is a data dependency between the first MB of a given row and the last MB in the previous row. To avoid this drawback the data dependency between the first MB of a given row and the last MB in the previous row can be handled during Stage 2 in order to allow the Stage 1 encoding to be done in parallel.

It is useful for the Stage 2 task of forming the final bitstream to be completed on a single encoder unit. This is because a slice can cross multiple video sections, but it must result in a single bitstream. That single encoder unit (e.g., the master encoder unit E0 or another designated encoder unit) takes the Stage 1 outputs from each encoder unit E0 ... EN as its input, and converts them to a single bitstream. To make this happen, there has to be a channel from each encoder unit to the single encoder unit that forms the final bitstream. It is noted that, due to the relatively high degree of compression that takes place during Stage 1, the amount of data that is transferred over these channels is considerably less than the total amount of data for the unencoded vertical sections. This greatly eases the bandwidth requirements for these data channels.

In some embodiments of the invention, the de-blocking and other post processing can be done on the master encoder unit E0 or can be offloaded this to some other processor. Bandwidth considerations may dictate whether it is better to do the post processing of the vertical sections S0 ... SN locally on the corresponding encoder units E0 ... EN or to offload this process to the master encoder E0 or some other processor. For example, de-blocking generally involves uncompressed pixel data. Therefore, if bandwidth is limited it may be preferable to de-block of each vertical section locally with its corresponding encoder unit. This avoids having to transfer large amounts of uncompressed data. However, if bandwidth is not an issue, all of the vertical sections could be de-blocked by the master encoder unit E0 or offloaded to some other processor or processors.

3) Stage 1: Parallel Entropy Encoding.

As noted above, during Stage 1, all of the encoder units E0 ... EN can perform part of the entropy encoding task in parallel. In particular, the bit representation of each symbol within the vertical sections S0 ... SN can be generated by corresponding encoder units E0 ... EN. Entropy encoding can only be partially completed for each MB during this process because some syntax element derivation and/or encoding involves data dependencies across vertical section boundaries. Some of these data dependencies can be addressed by transferring certain needed data from an encoder unit handling a given section to the encoder unit handling a neighbor of the given section. The data that needs to be transferred from an encoder unit handling a given section to the encoder unit handling a neighbor of the given section is referred to herein as boundary syntax data. In the example illustrated in FIG. 2, boundary syntax data $206_0$, $206_1, \ldots 206_{N-1}$ for sections S0, S1, ... SN−1 are transferred from encoder units E0, E1, ... EN−1 (not shown) to the encoder units E1, E2 (not shown), ... EN that are encoding their immediate next neighbor sections S1, S2 (not shown), ... SN, respectively.

The content of the boundary syntax data can depend on the specific codec or implementation used. By way of example, and not by way of limitation, for a CAVALC implementation of the AVC standard, boundary syntax data may include the number of non-zero coefficients for every sub-unit in a last sub-section (e.g., every block in a last macroblock) for a given vertical section. Alternatively, for a CABAC implementation of the AVC standard, boundary syntax data may include subsection (e.g., macroblock) syntax elements whose context index increment needs to be derived, e.g., as specified in AVC standard 9.3.3.1.1, which is incorporated herein by reference.

As also noted above, some data dependency may exist between the last vertical section SN and the first vertical section S0. Consequently it may be impractical to implement certain parts of entropy coding entirely in parallel. By way of example, and not by way of limitation, for CAVLC, the whole macroblock encoding process of skipped macroblocks is skipped.

For CAVLC, in the final output stream, the data for each non-skipped macroblock includes a symbol called "MB_skip_run", which is a counter of the number of skipped macroblocks between the current macroblock and the previous non-skipped macroblock. For CAVLC, if a stage 1 encoder sets the coded bits for a given macroblock to 0, the stage 2 encoder knows that this macroblock is skipped. So, there is no need in CAVLC for a separate flag to indicate whether a macroblock is skipped in the CAVCL case. For CAVALC, nearly all MB syntax elements can be encoded in Stage 1 except for MB_skip_run.

The derivation of MB_skip_run can cross a whole slice and therefore can cross multiple section boundaries. It may be impractical to determine an exact value of MB_skip_run within a vertical section. In such cases MB_skip_run can be encoded in Stage 2. The data needed to compute MB_skip_run is not transferred across vertical section boundaries with the boundary syntax data, but can instead be transmitted from each slave encoder unit E1 ... EN to the master encoder unit E0 as part of output data $202_0, 202_1 \ldots 202_N$ transmitted in the partially encoded bitstreams. The data needed to compute MB_skip_run is not compressed, however it represents a relatively small amount of data compared to the total output for a given vertical section. Consequently, transferring the data needed from each slave encoder unit E1 ... EN to the encoder (e.g., E0) that encodes MB_skip_run in Stage 2 does not require a large bandwidth. To facilitate computation of MB_skip_run in Stage 2, a skip flag is not transferred. The previous MB skipped flag is not used for stage 1 encoding and is not transferred as part of the boundary data.

For a CABAC implementation, the situation is slight different. Specifically, in CABAC, each macroblock has a symbol called "mb_skip_flag". For skipped macroblocks only, "mb_skip_flag=1" is coded and all other encoding processes are skipped. For non-skipped macroblocks, "mb_skip_flag=0" is coded along with other macroblock data. For CABAC, "mb_skip_flag" is encoded in the stage 1 output bin stream. The bin stream is transferred to stage 2 and stage 2 encodes "mb_skip_flag" the same as other MB bins.

Another syntax element that often needs to be derived as part of entropy coding is referred to herein as a subsection QP difference. This syntax element refers to a difference in the value of a quantization parameter between one subsection (e.g., one macroblock) and the next subsection that is to be encoded. The quantization parameter is a setting used by many codecs, such as H.264, to control the quality of video compression. The quantization parameter regulates the amount of spatial detail that is saved when picture data is compressed. One example of a subsection QP difference is known in the H.264 codec as MB_qp_delta, which is a difference in certain macroblock-level quantization parameters. The subsection QP difference for each subsection may be encoded in either Stage 1 or Stage 2, depending on which solution is used. The derivation of the subsection QP difference for a given section may depend on its previous subsection's syntax information. If the current subsection is the first subsection in a row, its subsection QP difference value can depend on the last subsection in the previous subsection row. Whether the subsection QP difference can be encoded in stage 1 or stage 2 depends on whether this data dependency between the first vertical section and the last vertical section can be cut off. Examples of different solutions are described below in section 7) below.

For CABAC implementations of AVC, it is possible to complete binarization for all or part of the subsection (e.g., macroblock) syntax elements in this stage, and the resulting bin string can be included in the Stage 1 outputs $202_0 \ldots 202_N$. Optionally, the Stage 1 encoders can also derive all or part of certain other intermediate data that can be used in stage 2 encoding, e.g., a context index (ctxIdx) or context index increment (ctxIdxInc) for each subsection as additional outputs. There are two steps in CABAC encoding. The first step, often called binarization, maps each syntax element to a bin string. The second step is to encode the bin string to a bitstream. There is strong data dependency among neighboring subsections (e.g., macroblocks) within a slice. A CABAC engine (which determines an offset and range) and a context model from a context table are used to encode each bin, and are updated after that bin is encoded. This means the order of bins to encode cannot be changed. Otherwise, an illegal bitstream output would be produced. As a result, step 2 must be processed sequentially for all subsections in a picture, and cannot be distributed by processing multiple vertical sections in parallel. In such a case, it is useful for step 2 to be completed in Stage 2.

By way of example, and not by way of limitation, the derivation of MB_qp_delta is the same for CABAC as for CAVLC. However, to encode MB_qp_delta in a CABAC implementation the ctxIdxInc information is needed. Deriving the ctxIdxInc for a given macroblock requires MB_type, coded block pattern (CBP) and the MB_qp_delta for the previous MB, which is unknown for the first MB column in the first vertical section. Consequently, in such a case, MB_qp_delta has to be encoded in Stage 2.

4) Stage 2: Encode and Form Final Bitstream

As indicated above Stage 2 encoding can be a sequential process that is implemented on a single encode unit. This single encoder unit is referred to herein as the Stage 2 encoder unit. In the example discussed above, this encoder unit can be the master encoder unit E0. However, embodiments of the present invention are not limited to such implementations. The Stage 2 encoder unit may alternatively, be any of the slave encoder units E1 . . . EN or a completely separate encoder unit. The Stage 2 encoder unit takes the stage 1 encoding outputs $202_0 \ldots 202_N$ from each encoder unit as its inputs, and outputs the final bitstream 204. The Stage 2 encoder unit may implement any or all of a number of tasks during Stage 2. Examples of such tasks include, but are not limited to: parsing the output of each Stage 1 encoder unit, finishing remaining bitstream encoding tasks, and concatenating the encoded bitstreams in order to form the final bitstream for output. As used herein, concatenating an encoded bitstream means to append it to the final bitstream.

The remaining bitstream encoding tasks implemented by the Stage 2 encoder may vary depending on the particular codec or implementation used. By way of example and not by way of limitation, for an AVC CAVLC implementation, the remaining bitstream encoding tasks can include: deriving and encoding MB_skip_run; and, optionally, deriving and encoding MB_qp_delta, depending on which solution is used as described in section 7 below.

By way of further example and not by way of limitation, for an AVC CABAC implementation, the remaining bitstream encoding tasks can optionally include calculating MB_qp_delta value and its ctxIdxInc value depending on which solution is used as described in section 7); and encoding bin strings from the Stage 1 outputs to bitstreams.

5) Reducing Bandwidth and Network Delay

Network bandwidth and delay are important factors when considering overall encoder performance. For an encoder to achieve better performance, it is often desirable to reduce the bandwidth and network delays as much as possible. As noted above, there are two types of data channels in the encoder 200. For convenience, these two different types of data channels are referred to herein as type A channels and type B channels. Type A channels are the data channels for transferring boundary syntax information $206_0 \ldots 206_{N-1}$ between encoder units processing neighboring vertical sections in one direction, e.g., from the encoder unit processing a given vertical section to the encoder processing the vertical section to the immediate right of the given vertical section. Type B data channels are used for transferring Stage 1 outputs $202_0 \ldots 202_N$ from the encoder units E0 . . . EN to the Stage 2 encoder unit. The bandwidth and network delays for type A channels can be regarded trivial as the data being transferred typically only involves subsection syntax for one column of subsections, e.g., one column of macroblocks. The bandwidth and network delays for type B channels are the major concern, as the data being transferred over these channels involves all the subsections in a picture. For CAVLC, this is not a big issue.

The Stage 1 output is primarily the partially encoded bitstream and the bandwidth consumed by this bitstream is not significant due to the high degree of compression obtained in Stage 1.

Figure 3A:
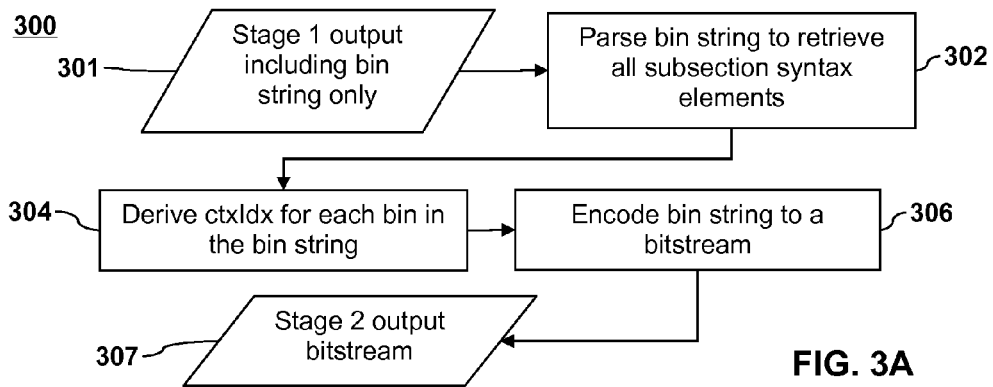
FIGS. 3A-3C are flow diagrams illustrating different possibilities for implementing a second stage of entropy coding in a CABAC implementation according to alternative implementations of certain embodiments of the present invention.

For CABAC, the situation is more complicated. There are three possibilities for handling the Stage 1 output in a CABAC implementation. As depicted in FIG. 3A, a first possibility 300 is for the Stage 1 encoders E0 . . . EN to output the bin string only as Stage 1 output 301. Then at Stage 2, the Stage 2 encoder can parse the bin string to retrieve all the subsection (e.g., macroblock) syntax elements from the Stage 1 output 301 as indicated at 302. The Stage 2 encoder unit can derive ctxIdx for each bin in the bin string as indicated at 304, and encode the bin string to a bitstream as indicated at 306 to produce a Stage 2 output bitstream 307. Among the three possibilities, this solution requires the minimum bandwidth and introduces the smallest network delays. However, this solution comes at the price of introducing the greatest amount of sequential computation cost of the three possibilities.

Figure 3B:
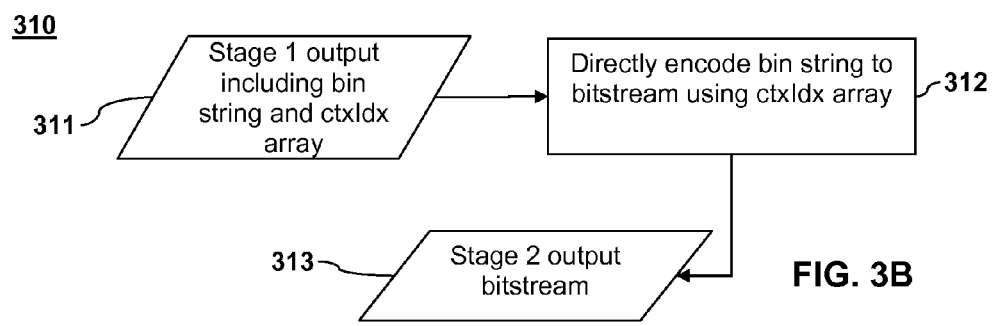

A second possibility 310, illustrated in FIG. 3B, is for the Stage 1 encoders E0 . . . EN to output a bin string and a ctxIdx array which stores ctxIdx for each bin in the bin string as Stage 1 output 311. Then, the Stage 2 encoder unit can directly encode the bitstream from the bin string, with the help of ctxIdx array as indicated at 312 to produce a Stage 2 output bitstream 313. This saves the computation of bin string parsing and ctxIdx derivation. Thus the sequential computation cost and the overall computation cost is the minimum of the three possibilities. But the bandwidth requirement and network delay are relatively high compared to the other two possibilities, as the ctxIdx for each bin has to be transferred as part of the Stage 1 output 311.

Figure 3C:
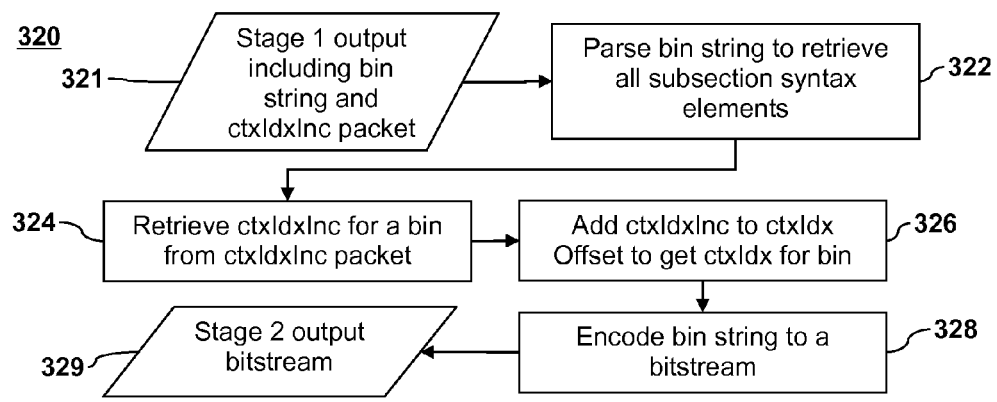

A third possibility 320 shown in FIG. 3C is a tradeoff between the first and second possibilities. For each subsection, e.g., each MB, the Stage 1 output 321 can include the bin string plus a ctxIdxInc packet. Then in Stage 2, the Stage 2 encoder unit still does bin string parsing as indicated at 322 and encodes the bin string to a bitstream as indicated at 328 to provide the stage 2 output 329. However, in this implementation, the Stage 2 encoder does not need to derive ctxIdxInc based on its neighbor MB's syntax info. Instead, it can directly retrieve the ctxIdxInc from the ctxIdxInc packet, as indicated at 324, and add to ctxIdx Offset to get the ctxIdx for a bin as indicated at 326. This saves sequential computation cost compared to the first possibility 300. Since only a small portion of the subsection syntax elements requires ctxIdxInc to calculate ctxIdx, the size of the ctxIdxInc packet for one subsection can be quite small, usually less than or comparable to the size of the bin string itself. This saves bandwidth and network delay significantly compared to the second possibility 310.

6) Solution for Encoding MB_Skip_Run in CAVLC

As discussed above in section 3), in CABAC, the MB_skip_flag is encoded in the first stage the same way as the other macroblock bins. Consequently, there is no further description of skipped macroblock handling for CABAC cases.

Figure 4:
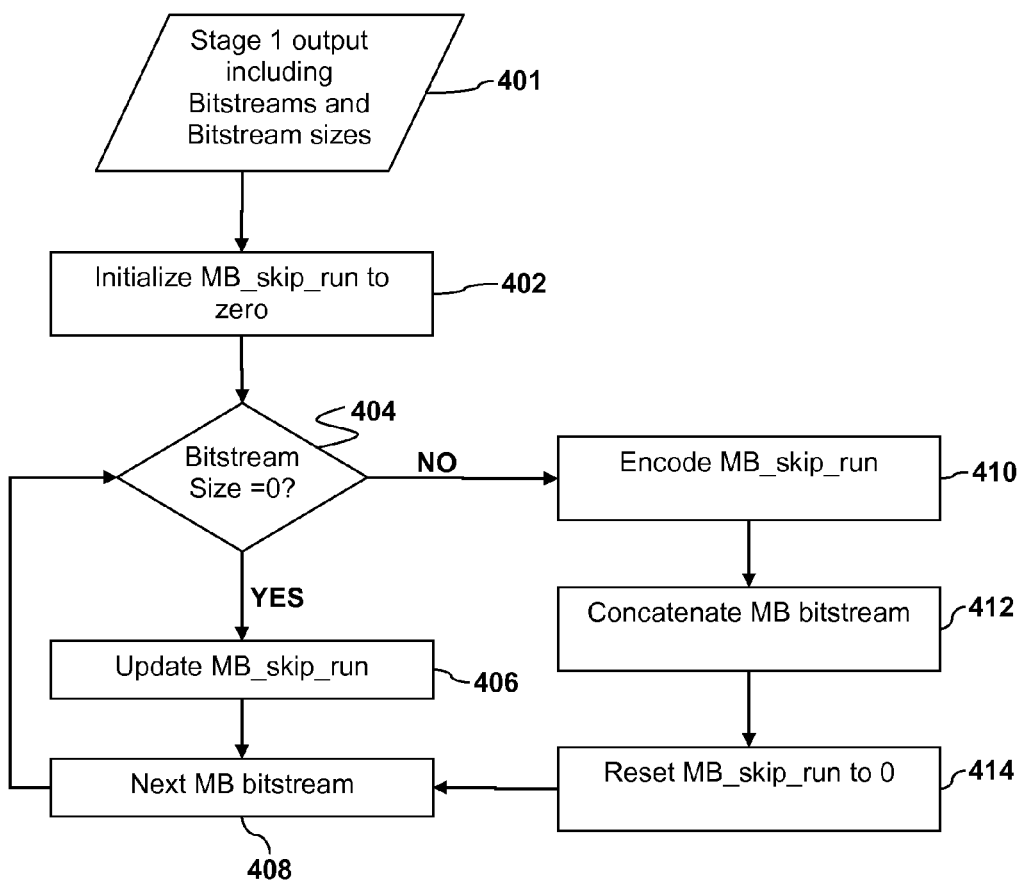
FIG. 4 is a flow diagram illustrating a possible implementation of handling subsection skip run computation for entropy coding in a CAVLC implementation according to certain embodiments of the present invention.

As mentioned above in section 3), the derivation of MB_skip_run in CAVLC involves dependencies that cross boundaries between vertical sections. Consequently, it is more practical to derive MB_skip_run in Stage 2 during the bitstream combining process. FIG. 4 illustrates a possible Stage 2 method 400 for handling MB_skip_run in a CAVLC implementation. To solve this problem, the MB bitstream size can be transferred along with the MB bitstream to the stage 2 encoder unit as part of the Stage 1 output 401. In Stage 2, MB_skip_run can be initialized to 0 as indicated at 402. Then for each incoming MB bitstream, the Stage 2 encoder can determine whether a given macroblock is skipped by checking the MB bitstream size as indicated at 404. An MB bitstream size of 0 for a give MB means that the MB is a skipped MB. If the MB bitstream size is determined to be zero at 404, the corresponding MB is a skipped MB and the Stage 2 encoder can update MB_skip_run as indicated at 406 and continue to the next MB as indicated at 408. If, at 404 the MB bitstream size is determined to be other than zero, the Stage 2 encoder can encode MB_skip_run as indicated at 410, concatenate the MB bitstream as indicated at 412, and reset MB_skip_run to 0 as indicated at 414 before proceeding to the next MB bitstream at 408. In this way, MB_skip_run can be derived and encoded in Stage 2. It is noted that the foregoing is only an example of handling a skip run calculation in Stage 2 of a parallel entropy coding method with the scope of embodiments of the present invention. This method can be generalized to handling the skip run for other subsection sizes (e.g., blocks) and is not limited to a skip run calculation for macroblocks.

7) Solutions for Encoding MB_QP_Delta (both CAVLC and CABAC)

As mentioned in section 3), a subsection QP difference is used in certain codecs as part of the encoding process. By way of example, and not by way of limitation, a macroblock quantization parameter, MB_qp_delta is used in both CAVLC and CABAC implementations of AVC codecs, such as H.264. In such codecs, there are two QP values for each macroblock (MB). One quantization parameter is referred to as the encoder assigned QP. The encoder assigned QP may be meaningless, e.g., if MB_qp_delta does not exist for a macroblock. For example, if a given macroblock is skipped or if both CBP==0 and MB_type is not intra 16×16 are true, MB_qp_delta does not exist for the given macroblock. In this case, its encoder assigned QP would be meaningless. The other quantization parameter is known as the reconstructed QP. According to the AVC spec, if MB_qp_delta does not exist for a given macroblock the reconstructed QP for the given macroblock is the same as its previous MB's reconstructed QP. If MB_qp_delta does exist for a given macroblock, the reconstructed QP for the given macroblock is the same as the encoder assigned QP for the given macroblock. MB_qp_delta is specified as the reconstructed QP of the current MB minus the reconstructed QP of its previous MB. In other words, the derivation of MB_qp_delta depends on the previous MB's reconstructed QP. For CABAC, the encoding of MB_qp_delta also requires the previous MB's syntax info. This introduces the aforementioned data dependency of the first vertical section S0 on the last vertical section SN. As mentioned in the end of section 2), for the sake of performance, it is generally desirable not to add a channel between the encoder unit EN for the last video section SN and the encoder unit E0 for the first video section S0. A key feature of embodiments that avoid such a data channel (and corresponding data dependency) is some solution for encoding the subsection QP difference (e.g., MB_qp_delta) for both CAVLC and CABAC implementations.

By way of example, and not by way of limitation, solutions for encoding the subsection QP difference include the following solutions referred to as Solution 1 and Solution 2. The flow diagram in FIGS. 5A-5B illustrate methods for implementing Solution 1 in conjunction with parallel entropy coding of the type depicted in FIG. 2.

Figure 5A:
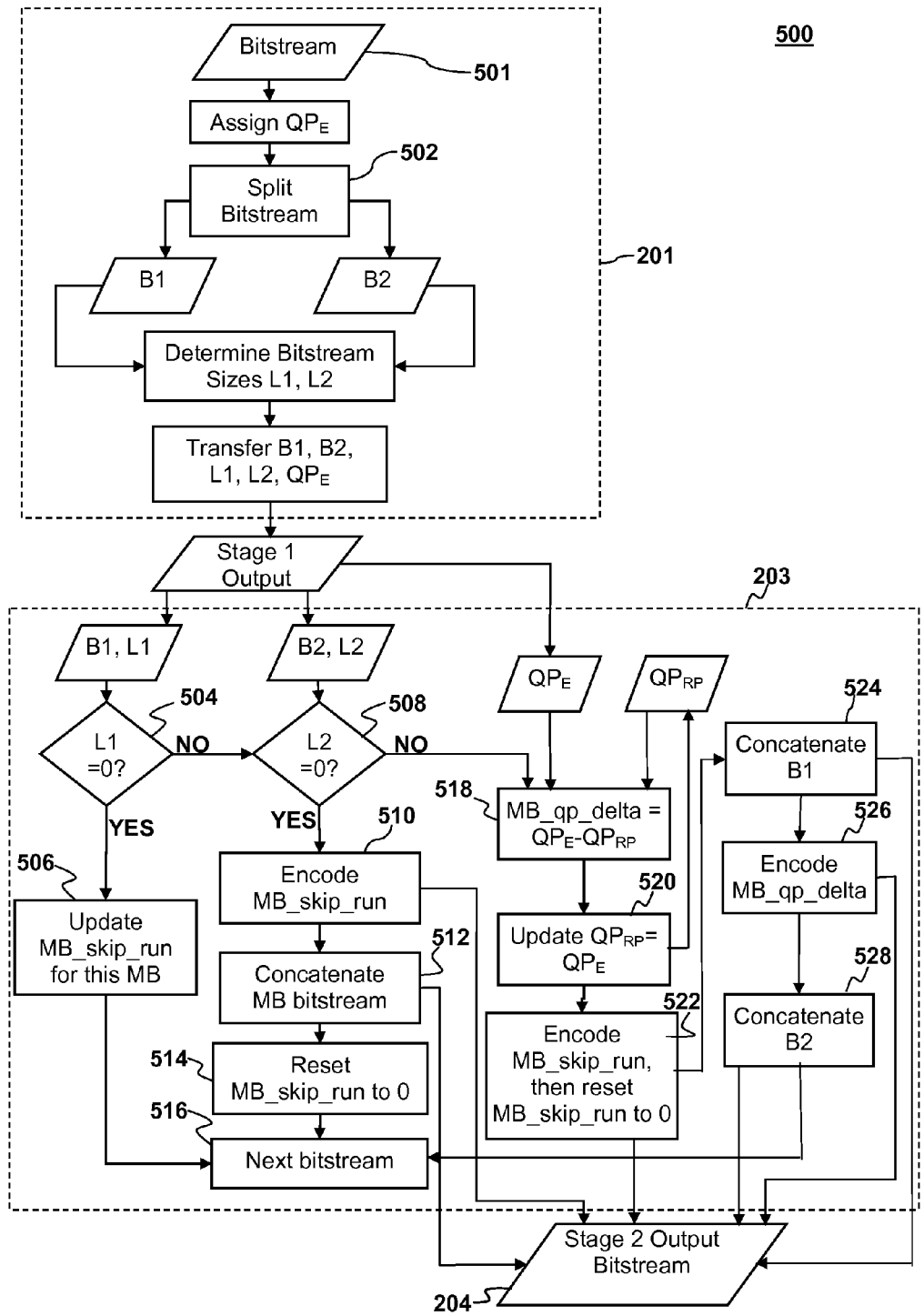
FIG. 5A is a flow diagram illustrating a first possible implementation of handling subsection QP difference encoding in entropy coding in a CAVLC implementation according to certain embodiments of the present invention.
Figure 5B:
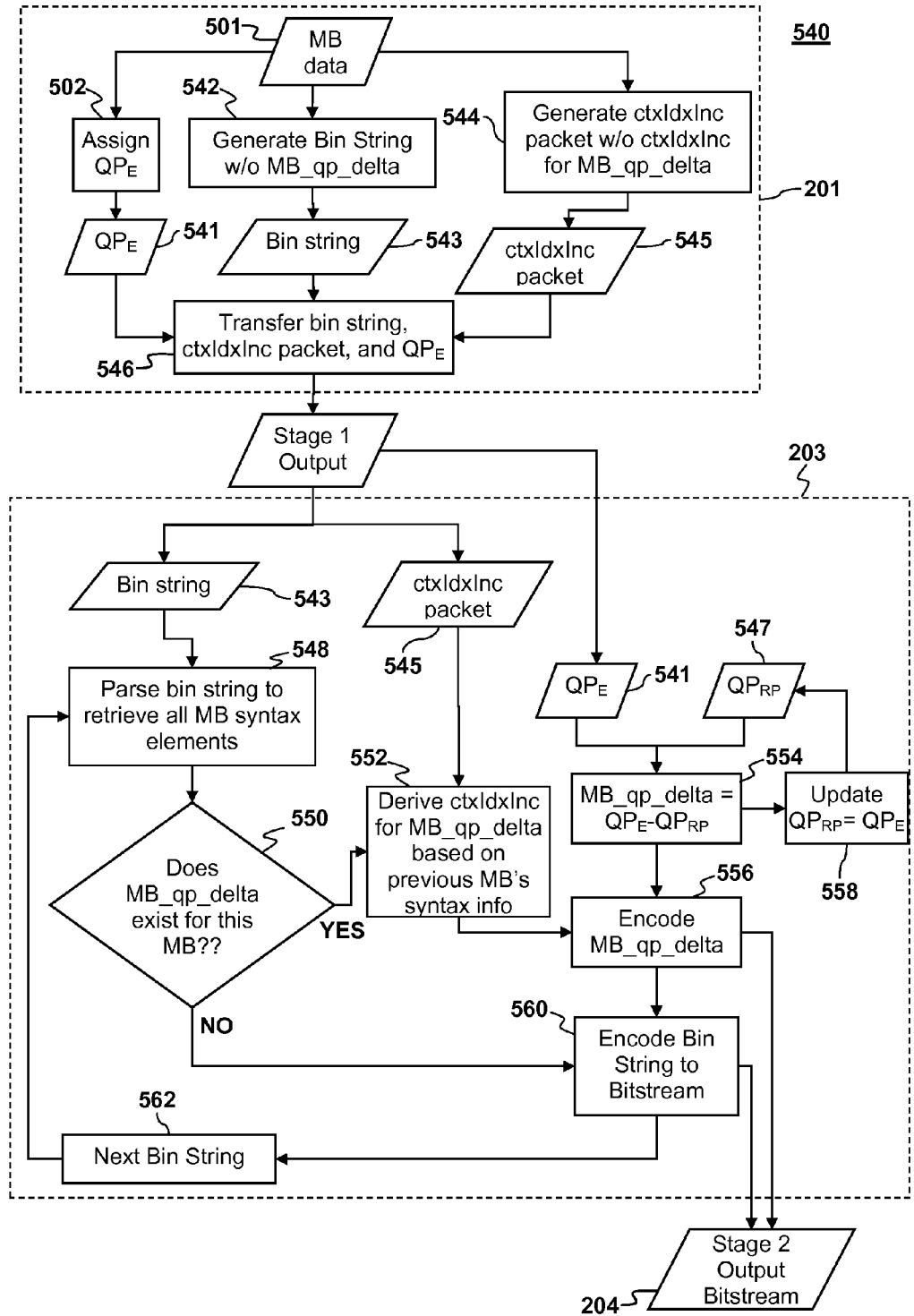
FIG. 5B is a flow diagram illustrating a first possible implementation of handling subsection QP difference encoding in entropy coding in a CABAC implementation according to certain embodiments of the present invention.

As shown in FIGS. 5A-5B in Solution 1 the Stage 1 encoders 201 can add an encoder-assigned QP value denoted $QP_E$ for each subsection (e.g., each MB) in the Stage 1 outputs $202_0 \ldots 202_N$. The implementations of Solution 1 are slightly different for CAVLC and CABAC.

For CAVLC, the MB bitstream 501 is split to two parts referred to as B1 and B2, as shown in FIG. 5A. The first part B1 contains the bitstream before MB_qp_delta. The second part B2 contains the bitstream after MB_qp_delta. The Stage 1 encoder 201 does not encode MB_qp_delta in either of these bitstreams. Similar to the idea described above in section 6) and illustrated in FIG. 4, the Stage 1 encoders 201 send bitstream sizes along with both bitstream parts B1, B2. For convenience, the bitstream size for the first part B1 is referred to herein as L1, and the bitstream size for the second part B2 is referred to herein as L2. The Stage 1 encoders 201 send both bitstreams B2, B2 and their respective bitstream sizes L1, L2 to the Stage 2 encoder unit 203 as part of the Stage 1 outputs $202_0 \ldots 202_N$.

To encode the value of MB_qp_delta, the Stage 2 encoder 203 can first compare the bitstream sizes L1, L2 to zero as indicated at 504 and 508. There are three possible cases. In a first possible case, L1 is 0. This implies L2 is also 0. The MB for the bitstreams B1, B2 is therefore a skipped MB.

The Stage 2 encoder can simply update MB_skip_run for this MB as indicated at 506 and proceed to the bitstreams for the next MB as indicated at 516.

In a second possible case, the Stage 2 encoder 203 may determine that L1 is not zero at 504 but that L2 is zero at 508. In this situation, the MB corresponding to the bitstreams B1, B2 is not a skipped MB, but there is no MB_qp_delta value for this MB. In this case, the Stage 2 encoder can encode MB_skip_run as indicated at 510, concatenate the first part bitstream B1 as indicated at 512. Since L2 is zero, the second part bitstream B2 is empty so there is no need to go further with the second part bitstream B2. Then MB_skip_run can be reset to be 0, as indicated at 514. The Stage 2 encoder 203 can then proceed to the bitstreams for the next MB, as indicated at 516.

In a third possible case, the Stage 2 encoder 203 may determine that L1 is not zero at 504 and that L2 is also not zero at 508. In this situation, a reconstructed QP value for the current MB denoted $QP_R$ is the same as the encoder assigned value $QP_E$. As indicated at 518, the Stage 2 encoder 203 can derive the value of MB_qp_delta as the difference between the encoder assigned QP value $QP_E$ and the reconstructed QP value for the previous MB (denoted $QP_{RP}$). The Stage 2 encoder 203 can update previous reconstructed QP value $QP_{RP}$ to be the encoder assigned QP value $QP_E$ as indicated at 520. The stage 2 encoder 203 can encode MB_skip_run and then reset MB_skip_run to 0 as indicated at 522 and concatenate first part bitstream B1 into the Stage 2 bitstream 204 as indicated at 524. The Stage 2 encoder can also encode MB_qp_delta as indicated at 526 and concatenate the second part bitstream B2 into the Stage 2 bitstream 204 as indicated at 528. When encoding some syntax elements such as MB_skip_run or MB_qp_delta in stage 2, the Stage 2 encoder can append the coded data to the Stage 2 output bitstream 204.

In this way, both MB_skip_run and MB_qp_delta can be encoded in stage 2 for CAVLC. It is noted that the method depicted in FIG. 5A can be applied to encoding subsection skip run and subsection QP difference values for subsection sizes other than macroblocks in embodiments of the present invention.

The flow diagram shown in FIG. 5B illustrates the Solution 1 implementation for CABAC. In this implementation, the Stage 1 encoder 201 assigns a QP value $QP_E$ to MB data 541 as indicated at 502. As indicated at 542, the Stage 1 encoder 201 also generates a Bin string 543 from the MB data 541 but skips MB_qp_delta in the bin string. As indicated at 544, the Stage 1 encoder 201 also generates a ctxIdxInc packet 545, but skips the ctxIdxInc corresponding to MB_qp_delta in the ctxIdxInc packet. The Stage 1 encoder 201 transfers the QP value $QP_E$, the bin string 543, and the ctxIdxInc packet 545 to the Stage 2 encoder 203 as indicated at 546.

The stage 2 encoder 203 parses the bin string 543 for a current MB as indicated at 548. During bin string parsing process for the current MB, the Stage 2 encoder 203 can determine whether MB_qp_delta exists for the current MB, as indicated at 550. If at 550 it is determined that MB_qp_delta does not exist, the Stage 2 encoder 203 can encode the bin string 543 to the Stage 2 output Bitstream 204, as indicated at 560.

If it is determined at 550 that MB_qp_delta does exist, the Stage 2 encoder 203 can derive the ctxIdxInc for MB_qp_delta as indicated at 552 based on the previous MB's syntax information, which can be made available from the bin string parsing of the previous MB. With this information, the Stage 2 encoder 203 can encode MB_qp_delta, as indicated at 556. The derivation of the value of MB_qp_delta can be implemented in the same fashion as in the CAVLC implementation described above with respect to FIG. 5A. Specifically, as indicated at 554, MB_qp_delta can be derived from the difference between the Stage 1 encoder-assigned QP value $QP_E$ extracted from the Stage 1 output and the reconstructed QP value $QP_{RP}$ for the previous MB. The value of $QP_{RP}$ can be updated to the value of $Q_E$, as indicated at 558. The Stage 2 encoder 203 can encode the bin string 543 to the Stage 2 output Bitstream 204, as indicated at 560.

As noted above, there is a second solution for encoding the subsection QP differences. Solution 2 is to cut off the dependency between the encoding of the first vertical section S0 and the encoding of the last vertical section SN. By way of example, the Stage 1 encoder 201 or Stage 2 encoder 203 can assign a fixed value to the encoder-assigned QP for the last column of subsections (e.g., the last MB column) in a picture. In this solution the encoder can force each subsection in this last column to always have a subsection QP difference value syntax element in order to adjust their QP value to that fixed QP value. In this way, the derivation of the subsection QP difference value for the first subsection in each row of subsections for the picture is totally independent of the QP value for the last subsection in the previous row.

Figure 6A:
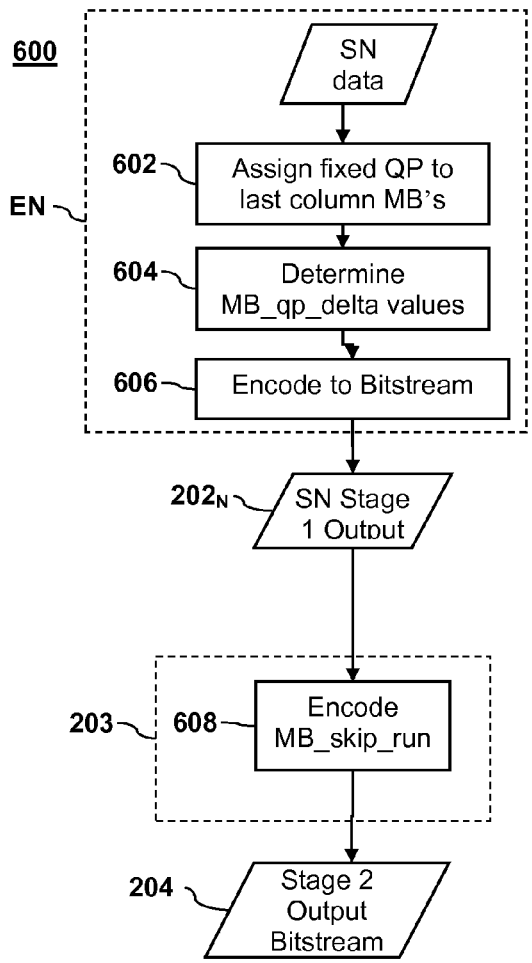
FIG. 6A is a flow diagram illustrating a second possible implementation of handling subsection QP difference encoding in entropy coding in a CAVLC implementation according to certain embodiments of the present invention.
Figure 6B:
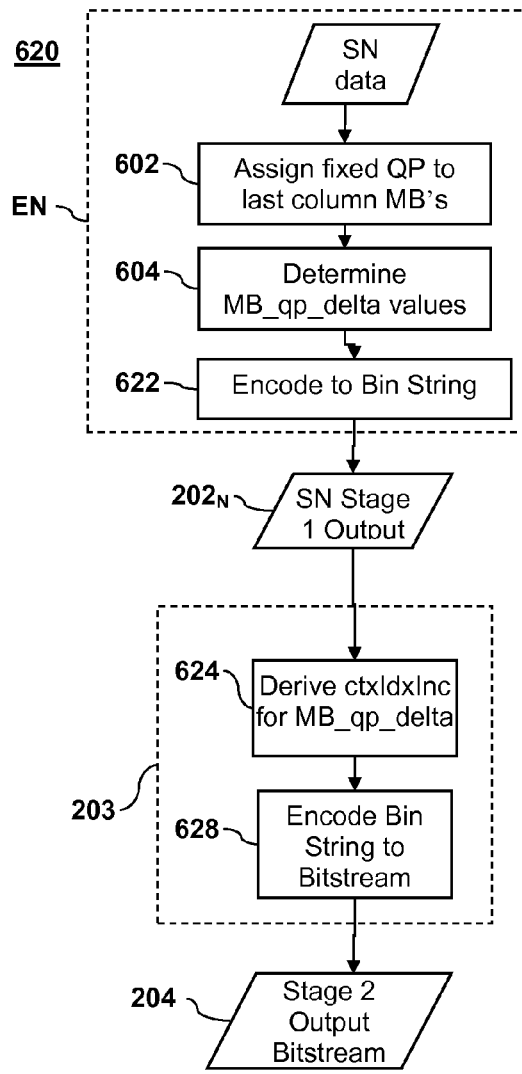
FIG. 6B is a flow diagram illustrating a second possible implementation of handling subsection QP difference encoding in entropy coding in a CABAC implementation according to certain embodiments of the present invention.

By way of example, and not by way of limitation, FIGS. 6A-6B illustrate methods 600, 620 for implementing solution 2 in CAVLC and CABAC respectively. As shown in both FIG. 6A and FIG. 6B, the Stage 1 encoder EN for the last vertical section SN can assign fixed value of $QP_E$ to each of the last column macroblocks as indicated at 602, determine MB_qp_delta from the fixed value $QP_E$ and the reconstructed QP value $QP_{RP}$ for the previous MB, as indicated at 604. As shown in FIG. 6A, in the CAVALC implementation, the Stage 1 encoder 201 can encode MB_qp_delta for the last column of macroblocks to the Stage 1 output bitstream $202_N$, as indicated at 606. The Stage 2 encoder 203 can encode MB_skip_run as indicated at 608. By way of example, and not by way of limitation the encoding of MB_skip_run can be implemented, e.g., as described above in section 6) with respect to FIG. 4.

In the CABAC implementation depicted in FIG. 6B, the Stage 1 encoder can derive MB_qp_delta the same way as for CAVLC and put MB_qp_delta into the bin string, as indicated at 622 The bin string is sent to the Stage 2 encoder 203 as part of the Stage 1 output $202_N$.

The Stage 2 encoder 203 can derive ctxIdxInc for MB_qp_delta from the Stage 1 output as indicated at 624. By way of example, the Stage 2 encoder 203 can derive ctxIdxInc for MB_qp_delta if the MB_type, coded block pattern (CBP) and MB_qp_delta from the previous MB are known.

MB_type generally refers to a syntax element specifying the type of macroblock that is being encoded. MB_type can be used to control the encoding of MB_qp_delta. For example, if MB_type is intra 16×16, MB_qp_delta is encoded whether the DCT coefficients are zero or not. If the macroblock is not coded as intra 16×16, MB_qp_delta is only encoded when the macroblock has non-zero DCT coefficients.

CBP generally refers to that represents whether coefficient data needs to be encoded in a particular sub-sub-section (e.g., a particular 8×8 block within a 16×16 macroblock). It is similar to skip run, but within a subsection.

The processing of ctxIdxInc for MB_qp_delta can be implemented, e.g., as described above with respect to FIG. 5B for the CABAC implementation of solution 1. The Stage 2 encoder can then encode the bin string (which already includes the bit representation of MB_qp_delta), as indicated at 628, to the Stage 2 output bit stream 204. It is noted that the Stage 2 encoder 203 can derive ctxIdxInc for MB_qp_delta from the Stage 1 output during the process of encoding of the bin string.

Figure 7:
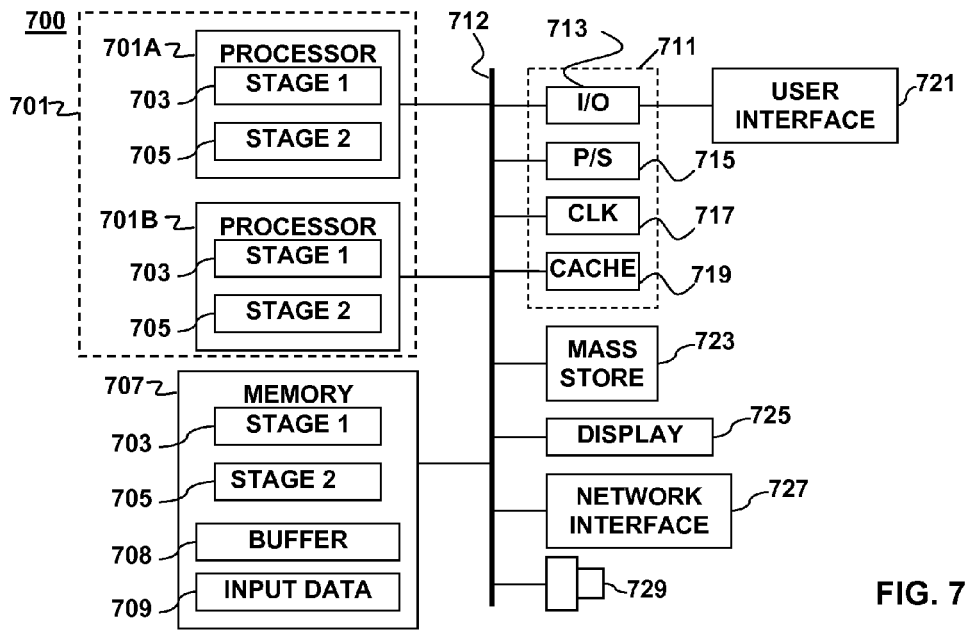
FIG. 7 illustrates a block diagram of an example of an encoder unit that may be used to implement one or more stages of parallel entropy coding in accordance with an embodiment of the present invention.

In embodiments of the present invention, suitably configured encoder units can implement Stage 1 and Stage 2 of parallel entropy coding as described above. FIG. 7 illustrates a block diagram of an example of an encoder unit 700 that can implement a part of Stage 1 parallel entropy coding or Stage 2 of parallel entropy encoding or both, as described above. The encoder unit may include generally a processor module 701 and a memory 707. The processor module 701 may include one or more processor cores. An example of a processing system that uses multiple processor modules, is a CELL processor, examples of which are described in detail, e.g., in Cell Broadband Engine Architecture, which is available online at http://www-306.ibm.com/chips/techlib/techlib.nsf/techdocs/1AEEE1270EA2776387257060006E-61BA/$file/CBEA_01_pub.pdf, which is incorporated herein by reference.

The memory 707 may be in the form of an integrated circuit, e.g., RAM, DRAM, ROM, and the like. The memory may also be a main memory that is accessible by all of the processor modules of a multiple processor module processing system. In some embodiments, the processor module 701 may include multiple processor cores 701A, 701B and local memories associated with each core. A Stage 1 coder program 703 and/or Stage 2 coder program 705 may be stored in the main memory 707 in the form of processor executable instructions that can be executed on one or more cores of the processor module 701. The Stage coder program 703 and Stage 2 coder program 705 may be written in any suitable processor readable language, e.g., C, C++, JAVA, Assembly, MATLAB, FORTRAN and a number of other languages.

The Stage 1 coder programs 703, 705 may be configured to implement certain stages of entropy coding during encoding of a video picture into compressed signal data. By way of example, and not by way of limitation, the Stage 1 coder program 703 may be configured to implement encoding in parallel according to the processes described above. Specifically, the Stage 1 coder 703 may include instructions that, when executed perform a first stage of entropy coding on a vertical section of a video picture on a row-by-row basis in parallel with encoding of another section by another encoder unit, which may be configured similar to encoder unit 700.

The Stage 2 coder program 705 may include instructions that, when executed by the processor module 701 can generate a final coded bitstream from two or more partially encoded bitstreams produced by two or more corresponding Stage 1 encoders that execute the Stage 1 coder program 703 to produce two or more partially encoded bitstreams.

Data 709 may be stored in the memory 707. Such input data may include buffered portions of streaming data, e.g., encoded video pictures or sections thereof. During execution of the Stage 1 coder program 703 and/or the Stage 2 coder program 705, portions of program code and/or input data 709 may be loaded into the memory 707 or the local stores of processor cores for parallel processing by multiple processor cores. By way of example, and not by way of limitation, the data 709 may include data representing a video picture, or vertical sections thereof, before entropy coding, at intermediate stages of entropy coding, or after entropy coding. These various sections may be stored in one or more buffers 708, which may be implemented in the memory 707. In particular, sections may be stored in an output picture buffer implemented in the memory 707. The data 709 may also include outputs generated from the Stage 1 coder program 703 or Stage 2 coder program 705. Examples of Stage 1 encoder program outputs include, but are not limited to, partial bit streams, bin strings, and syntax elements, such as MB_skip_run, MB_qp_delta, ctxIdx, and ctxIdxInc. Examples of Stage 2 encoder outputs include final bitstreams.

The encoder unit 700 may also include well-known support functions 711, such as input/output (I/O) elements 713, power supplies (P/S) 715, a clock (CLK) 717, and cache 719. The encoder unit 700 may optionally include a mass storage device 723 such as a disk drive, CD-ROM drive, tape drive, or the like to store programs and/or data. The encoder unit 700 may also optionally include a display unit 725 and user interface unit 721 to facilitate interaction between the encoder unit 700 and a user. The display unit 725 may be in the form of a cathode ray tube (CRT) or flat panel screen that displays text, numerals, graphical symbols, or images. The user interface 721 may include a keyboard, mouse, joystick, light pen or other device that may be used in conjunction with a graphical user interface (GUI). The encoder unit 700 may also include a network interface 727 to enable the device to communicate with other devices over a network, such as the Internet. These components may be implemented in hardware, software, or firmware or some combination of two or more of these.

The processor modules 701, memory 707, support functions 711, user interface unit 721, display unit 725, and network interface may exchange data and instructions via a data bus 712.

In certain embodiments the encoder unit 700 may further include an image capture unit 729, such as a digital video camera, may be coupled to the processor units, e.g., via the I/O elements 713 and the data bus 712.

Figure 8:
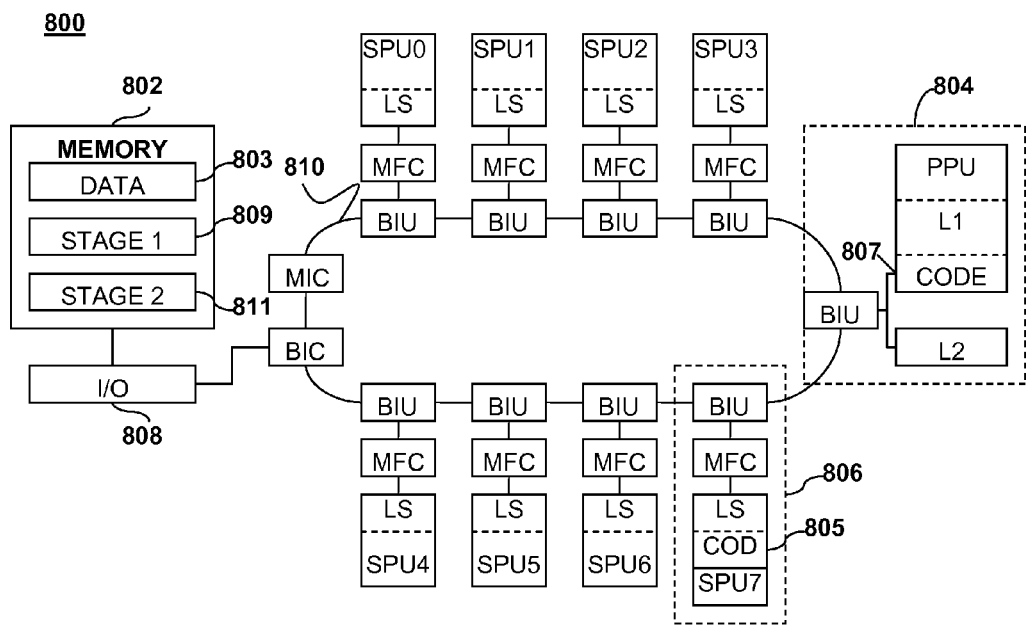
FIG. 8 illustrates an example of a CELL processor that may be apparatus that may be used to implement one or more stages of parallel encoding in accordance with an embodiment of the present invention.

There are a number of ways to streamline parallel processing with multiple processors in the encoder unit 700. One example, among others of a processing system capable of implementing parallel processing on three or more processors is a CELL processor. There are a number of processor architectures that may be categorized as CELL processors. By way of example, and without limitation, FIG. 8 illustrates a type of CELL processor 800 configured to operate as an encoder unit. It is noted that in certain embodiments, the cell processor 800 may implement both part of Stage 1 encoding in addition to Stage 2 encoding.

The CELL processor 800 includes a main memory 802, a single power processor element (PPE) 804, and eight synergistic processor elements (SPE) 806. Alternatively the CELL processor 800 may be configured with any number of SPEs. With respect to FIG. 8, the memory 802, PPE 804, and SPEs 806 can communicate with each other and with an I/O device 808 over a ring-type element interconnect bus 810. The memory 802 may contain data 803 having features in common with the data 709 described above, a Stage 1 coder program 809 and/or Stage 2 coder program 811. The Stage 1 coder program may have features in common with the Stage 1 coder program 703 described above. The Stage 2 coder program 811 may have features in common with the Stage 2 coder program 705 described above.

At least one of the SPE 806 may include in its local store (LS) code instructions 805 and/or a portion of the buffered input data. The code instructions may include a portion of the Stage 1 or Stage 2 encoder program. If the code instructions 805 include part of the Stage 1 encoder program 809, the buffered input data may include unencoded data for part of a vertical section of a video picture. If the code instructions 805 include part of the Stage 2 encoder program 811, the buffered input data may include one or more partially encoded bit-streams obtained from one or more Stage 1 encoder units.

The PPE 804 may include in its L1 cache, code instructions 807 having features in common with the coder program described above. Instructions 805 and data 807 may also be stored in memory 802 for access by the SPE 806 and PPE 804 when needed. By way of example, and not by way of limitation, the PPE 804 may be configured (e.g., by suitable programming) to divide the Stage 1 or Stage 2 encoder process into multiple tasks. Each task may include certain data and code for operating on that data. The PPE 804 may execute some of the tasks and assign other tasks to one or more of the SPE 806.

By way of example, the PPE 804 may be a 64-bit PowerPC Processor Unit (PPU) with associated caches. The PPE 804 may include an optional vector multimedia extension unit. Each SPE 806 includes a synergistic processor unit (SPU) and a local store (LS). In some implementations, a local store may have a capacity of, e.g., about 256 kilobytes of memory for code and data. The SPUs are less complex computational units than PPU, in that they typically do not perform any system management functions. The SPUs may have a single instruction multiple data (SIMD) capability and typically process data and initiate any required data transfers (subject to access properties set up by a PPE) in order to perform their allocated tasks. The SPUs allow the system 800 to implement applications that require a higher computational unit density and can effectively use the provided instruction set. A significant number of SPEs 806 in a system, managed by the PPE 804, allows for cost-effective processing over a wide range of applications. By way of example, the CELL processor 800 may be characterized by an architecture known as Cell Broadband engine architecture (CBEA). In CBEA-compliant architecture, multiple PPEs may be combined into a PPE group and multiple SPEs may be combined into an SPE group. For the purposes of example, the CELL processor 800 is depicted as having only a single SPE group and a single PPE group with a single SPE and a single PPE. Alternatively, a CELL processor can include multiple groups of power processor elements (PPE groups) and multiple groups of synergistic processor elements (SPE groups). CBEA-compliant processors are described in detail e.g., in Cell Broadband Engine Architecture, which is available online at: http://www-306.ibm.com/chips/techlib/techlib.nsf/techdocs/1AEEE1270EA2776387257060006E61BA/$file/CBEA_01_pub.pdf, which is incorporated herein by reference.

Figure 9:
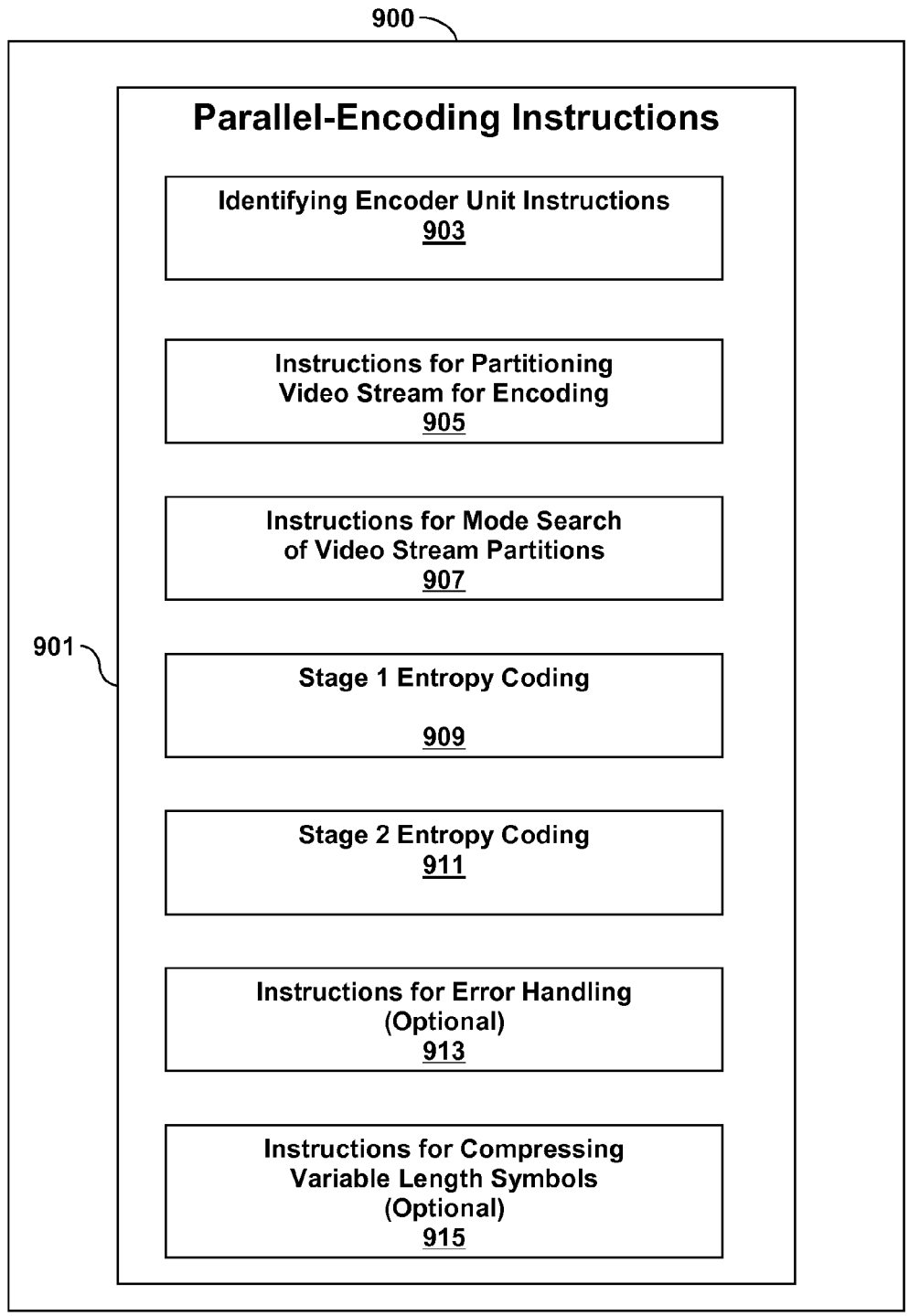
FIG. 9 illustrates an example of a computer-readable storage medium encoded with computer readable instructions for implementing parallel encoding in accordance with an embodiment of the present invention.

According to another embodiment, instructions for carrying out parallel entropy coding may be stored in a computer readable storage medium. By way of example, and not by way of limitation, FIG. 9 illustrates an example of a computer-readable storage medium 900 in accordance with an embodiment of the present invention. The storage medium 900 contains computer-readable instructions stored in a format that can be retrieved and interpreted by a computer processing device. By way of example and not by way of limitation, the computer-readable storage medium 900 may be a computer-readable memory, such as random access memory (RAM) or read only memory (ROM), a computer readable storage disk for a fixed disk drive (e.g., a hard disk drive), or a removable disk drive. In addition, the computer-readable storage medium 900 may be a flash memory device, a computer-readable tape, a CD-ROM, a DVD-ROM, a Blu-Ray, HD-DVD, UMD, or other optical storage medium.

The storage medium 900 contains parallel-encoding instructions 901 configured to implement parallel-encoding upon execution by a processor. The parallel-encoding instructions 901 may optionally include instructions for identifying encoder units 903, such that a master encoder unit and its corresponding client encoder units are identified in order to process a video stream in parallel. In addition, the parallel-encoding instructions 901 may optionally include instructions for partitioning the video stream 905 so that each individual encoder unit may process a partition of the video stream in parallel with all of the other encoder units. The parallel-encoding instructions 901 may also include instructions for performing a mode search on the video stream partitions 907. The mode search may be optionally implemented using the fast intra-mode search and early termination method described in commonly-assigned U.S. patent application Ser. No. 12/553,073, filed Sep. 2, 2009, the entire contents of which has been incorporated herein by reference above.

Additionally the parallel-encoding instructions may include Stage 1 entropy coding instructions 909 for implementing Stage 1 entropy coding of vertical sections of a video picture. The parallel-encoding instructions may also include Stage 2 entropy coding instructions 911 for implementing Stage 2 entropy coding on two or more partially encoded Stage 1 outputs. The parallel-encoding instructions 901 may also optionally include instructions for dealing with errors that may occur during the encoding process 913. Examples of such error handling are described, e.g., in commonly-assigned U.S. patent application Ser. No. 12/553,073, filed Sep. 2, 2009, the entire contents of which has been incorporated herein by reference above. Lastly, the parallel encoding instructions 901 may optionally include instructions for compressing variable length symbols that result from the encoding process 915, e.g., as described with respect to FIGS. 6A-6B of in commonly-assigned U.S. patent application Ser. No. 12/553,073, filed Sep. 2, 2009, the entire contents of which has been incorporated herein by reference above.

Embodiments of the present invention allow for more efficient and faster encoding of digital pictures that take full advantage of the capabilities of parallel processing capabilities in the entropy coding task. In certain embodiments and examples described above all three of mode search, entropy coding and de-blocking are performed in parallel for different sections of a digital picture with two or more encoder units. However, in other embodiments one or both of the mode search or de-blocking processes may be performed on a single encoder unit for the entire picture with the remaining one or two processes being performed in parallel for different sections on different encoder units.

Although the present invention has been described in considerable detail with reference to certain preferred versions thereof, other versions are possible. For example, although certain embodiments are described in which the subsections are identified as macroblocks, embodiments of the invention may include implementations in which the subsections are other than macroblocks. Therefore, the spirit and scope of the appended claims should not be limited to the description of the preferred versions contained herein. Instead, the scope of the invention should be determined with reference to the appended claims, along with their full scope of equivalents.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

The reader's attention is directed to all papers and documents which are filed concurrently with this specification and which are open to public inspection with this specification, and the contents of all such papers and documents incorporated herein by reference.

What is claimed is:

1. A method for parallel encoding digital pictures, comprising:
   a) partitioning a digital picture into two or more vertical sections;
   b) performing a first stage of entropy coding on the two or more vertical sections with two or more corresponding Stage 1 encoder units on a row-by-row basis, wherein the entropy coding of the two or more vertical sections is performed in parallel such that each Stage 1 encoder unit performs entropy coding on its respective vertical section and returns a partially coded Stage 1 output to a Stage 2 encoder unit, wherein each partially coded Stage 1 output includes a representation of data for a corresponding vertical section that has been compressed by a compression factor greater than 1; and c) generating a final coded bitstream with the Stage 2 encoder unit from the partially encoded bitstreams as a Stage 1 output.

2. The method of claim 1 wherein the compression factor is 50 or greater.

3. The method of claim 1, further comprising, prior to b), performing a mode search on the two or more vertical sections on a row-by-row basis.

4. The method of claim 1, wherein b) includes transferring boundary syntax data for a last sub-section of a row of one vertical section to an encoder that performs entropy coding for a vertical section that borders on the last sub-section.

5. The method of claim 4, wherein b) includes entropy coding using context adaptive variable length coding and the boundary syntax data includes a number of non-zero coefficients for every block.

6. The method of claim 4 wherein b) includes entropy coding using context adaptive binary arithmetic coding and the boundary syntax data includes one or more syntax elements from which a context index increment can be derived.

7. The method of claim 1, wherein b) and c) include entropy coding using context adaptive variable length coding and wherein b) and c) include avoiding data dependency between Stage 1 encoders in encoding a subsection skip run.

8. The method of claim 7, wherein the partially coded Stage 1 output generated by each Stage 1 encoder unit includes a bitstream containing partially encoded bits representing each subsection in the vertical section encoded by the given encoder unit, and a corresponding size of the bitstream.

9. The method of claim 8, wherein, during c), the Stage 2 encoder initializes a subsection skip run to 0 as indicated and, for each incoming MB bitstream, the Stage 2 encoder determines whether a given macroblock is skipped by checking the size of the bitstream.

10. The method of claim 9, wherein, if the bitstream size is determined to be zero, the corresponding subsection is a skipped subsection and the Stage 2 encoder updates the value of the subsection skip run, and wherein, if, the size of the bitstream size is determined to be other than zero, the Stage 2 encoder encode the subsection skip run, concatenate the bitstream, and reset subsection skip run to zero.

11. The method of claim 1 wherein b) and c) include entropy coding using context adaptive binary arithmetic coding and the partially coded Stage 1 output generated by each Stage 1 encoder unit includes a binary string containing a plurality of bins representing each subsection in the vertical section encoded by the given encoder unit.

12. The method of claim 11, wherein the Stage 1 encoders output the binary string only as the Stage 1 output, and wherein, during c), the Stage 2 encoder parses the binary string to retrieve all subsection syntax elements from the Stage 1 output and derives a context index for each bin in the bin string, and encode the bin string to the final coded bitstream.

13. The method of claim 11 wherein the partially coded Stage 1 output generated by each Stage 1 encoder unit further includes a context index array that stores a context index for each bin in the bin string.

14. The method of claim 13, wherein the Stage 1 encoders output the binary string and the context index array as the Stage 1 output and, during c), the Stage 2 encoder unit directly encodes the final coded bitstream from the bin string and the context index array.

15. The method of claim 11 wherein the partially coded Stage 1 output generated by each Stage 1 encoder unit further includes a context index increment packet that includes a context index increment for one or more bins in the bin string that require a context index increment to derive their context index.

16. The method of claim 15 wherein, during c), the Stage 2 encoder unit parses each bin string, retrieves a corresponding context index increment from the context index increment packet and adds the context index increment to a context index Offset to determine the context index for a bin.

17. The method of claim 1, wherein b) and c) include avoiding data dependency between Stage 1 encoders for first and last vertical sections in encoding a subsection quantization parameter (QP) difference.

18. The method of claim 17, wherein b) and c) include entropy coding using context adaptive variable length coding and wherein the Stage 1 output for a given subsection includes an encoder-assigned QP value ($QP_E$) for the given subsection, a first part containing a bitstream before the subsection QP difference, and a second part containing a bitstream after the subsection QP difference and wherein the subsection QP difference is not encoded in either the first or second parts, and wherein the Stage 1 output includes a first size for the first part and a second size for the second part.

19. The method of claim 18, wherein during c) the Stage 2 encoder unit compares the first and second sizes to zero, and wherein:

if the first size is zero, the Stage 2 encoder updates a subsection skip run for the given subsection, if the first size is not zero and the second size is zero, the Stage 2 encoder encodes the subsection skip run, concatenates the first part and resets the subsection skip run to zero, if both the first and second sizes are not zero, the Stage 2 encoder derives a value of the subsection QP difference as a difference between the encoder assigned QP value $QP_E$ and a reconstructed QP value for a previous subsection, updates the reconstructed QP value for the previous subsection with the encoder assigned QP value $QP_E$, encodes the subsection skip run and then sets the subsection skip run to zero, concatenates the first part into the Stage 2 Output, encodes the value of the subsection QP difference, and concatenates the second part into the Stage 2 Output.

20. The method of claim 17) wherein b) and c) include entropy coding using context adaptive binary arithmetic coding and wherein the Stage 1 output for a given subsection includes an encoder-assigned QP value ($QP_E$) for the given subsection, a binary string for the given subsection that does not include a value of a subsection QP difference, and a context index increment packet that does not include a context index increment corresponding to the subsection QP difference.

21. The method of claim 20 wherein during c), the stage 2 encoder parses the binary string and determines whether a subsection QP difference exists for the given subsection, wherein, if the subsection QP difference does not exist, the Stage 2 encoder encodes the binary string to the Stage 2 Output, if the subsection QP difference does exist, the Stage 2 encoder encodes the binary string and, during encoding of the binary string, the Stage 2 encoder derives the context index increment for the subsection QP difference based on a previous subsection's syntax information and encodes the subsection QP difference using the derived context index increment.

22. The method of claim 17 wherein b) and c) include cutting off a data dependency encoding of a first vertical section and encoding of a last vertical section.

23. The method of claim 22 wherein, for each subsection in a last column of subsections, the Stage 1 encoder assigns a fixed value to an encoder-assigned QP value ($QP_E$) and forces each subsection in the last column to always have a subsection QP difference value syntax element.

24. The method of claim 23 wherein the Stage 1 encoder assigns the fixed value and determines a subsection QP difference value for each subsection in the last column from the fixed value and a reconstructed QP value for a next-to-last column.

25. The method of claim 24, wherein b) and c) include entropy coding using context adaptive variable length coding, and wherein the Stage 1 encoder encodes the subsection QP difference value and wherein the Stage 2 encoder encodes a value of a subsection skip run from the Stage 1 output.

26. The method of claim 24, wherein b) and c) include entropy coding using context adaptive binary arithmetic coding, wherein the partially coded Stage 1 output generated by each Stage 1 encoder unit includes a binary string containing a plurality of bins representing each subsection in the vertical section encoded by the given encoder unit, and wherein the Stage 1 encoder includes determined subsection QP difference value into the binary string.

27. The method of claim 26 wherein the Stage 2 encoder derives a context index increment for the subsection QP difference from the Stage 1 output and encodes the subsection QP difference value and the binary string to the Stage 2 output.

28. A non-transitory computer-readable storage medium having computer executable program instructions embodied therein, wherein the computer executable program instructions are configured, when executed to:
   a) partition a digital picture into two or more vertical sections;
   b) perform a first stage of entropy coding on the two or more vertical sections with two or more corresponding Stage 1 encoder units on a row-by-row basis, wherein the entropy coding of the two or more vertical sections is performed in parallel such that each Stage 1 encoder unit performs entropy coding on its respective vertical section and returns a partially coded Stage 1 output to a Stage 2 encoder unit, wherein each partially coded Stage 1 output includes a representation of data for a corresponding vertical section that has been compressed by a compression factor greater than 1; and
   c) generate a final coded bitstream with the Stage 2 encoder unit from the partially encoded bitstreams as a Stage 2 output.

29. A system for parallel digital picture encoding, comprising:
   two or more Stage 1 encoder units;
   a Stage 2 encoder unit;
   a memory coupled to the Stage 1 and Stage 2 encoder units;
   instructions embodied in the memory and executable by the processor, wherein the instructions are configured to implement a method for the parallel encoding of the one or more digital pictures, wherein the computer executable program instructions are configured, when executed to:
   a) partition a digital picture into two or more vertical sections;
   b) perform a first stage of entropy coding on the two or more vertical sections with two or more corresponding Stage 1 encoder units on a row-by-row basis, wherein the entropy coding of the two or more vertical sections is performed in parallel such that each Stage 1 encoder unit performs entropy coding on its respective vertical section and returns a partially coded Stage 1 output to the Stage 2 encoder unit, wherein each partially coded Stage 1 output includes a representation of data for a corresponding vertical section that has been compressed by a compression factor greater than 1; and
   c) generate a final coded bitstream with the Stage 2 encoder unit from the partially encoded bitstreams as a Stage 2 output.

* * * * *